United States Patent [19]
Zhang

[11] Patent Number: 5,831,325
[45] Date of Patent: Nov. 3, 1998

[54] ANTIFUSE STRUCTURES WITH IMPROVED MANUFACTURABILITY

[76] Inventor: Guobiao Zhang, P.O. Box 9562, Berkeley, Calif. 94709-0562

[21] Appl. No.: 732,903

[22] Filed: Oct. 17, 1996

Related U.S. Application Data

[60] Provisional application No. 60/023,687 Aug. 16, 1996.
[51] Int. Cl.$^6$ .......................... H01L 29/00; H01L 23/48; H01L 23/52; H01L 29/40
[52] U.S. Cl. ............................................ 257/530; 257/751
[58] Field of Search ...................... 257/530, 751

[56] References Cited

U.S. PATENT DOCUMENTS

| | | | |
|---|---|---|---|
| 4,899,205 | 2/1990 | Hamdy et al. | 357/51 |
| 4,914,055 | 4/1990 | Gordon et al. | 437/192 |
| 4,937,650 | 6/1990 | Shinriki et al. | 357/51 |
| 5,070,384 | 12/1991 | McCollum et al. | 357/51 |
| 5,100,827 | 3/1992 | Lytle . | |
| 5,196,724 | 3/1993 | Gordon et al. | 257/530 |
| 5,266,829 | 11/1993 | Hamdy et al. | 257/530 |
| 5,373,169 | 12/1994 | McCollum et al. | 257/50 |
| 5,374,832 | 12/1994 | Tung et al. | 257/50 |
| 5,412,244 | 5/1995 | Hamdy et al. | 257/530 |
| 5,482,884 | 1/1996 | McCollum et al. | 437/60 |
| 5,485,031 | 1/1996 | Zhang et al. . | |
| 5,521,423 | 5/1996 | Shinriki et al. . | |
| 5,552,627 | 9/1996 | McCollum et al. | 257/530 |
| 5,572,409 | 11/1996 | Nathan et al. . | |
| 5,592,016 | 1/1997 | Go et al. . | |

OTHER PUBLICATIONS

Lachenbruch et al. "Contamination study of plasma etching", *Semiconductor International*, vol. 8, No. 5, pp. 164–168, May 1985.

*Handbook of Plasma Processing Technology—Fundamentals, Etching, Deposition and Surface Interaction*, pp. 215–217, 1990.

Awadelkarim et al. "Silicon Micromachining and its impact on materials and device properties: plasma–etching damage issues", *Proceedings of SPIE*, vol. 2448, pp. 130–140, 1995.

Aoki et al. "Direct analysis of contamination in submicron contact holes by thermal desorption spectroscopy", *Journal of Vacuum Science and Technology A*, vol. 13, No. 1, pp. 42–46, Jan.–Feb. 1995.

DeJule, "Managing etch and implant residue", *Semiconductor International*, vol. 20, No. 9, pp. 56–64, Aug. 1997.

*Primary Examiner*—Stephen D. Meier

[57] ABSTRACT

An antifuse structure of the present invention comprises an antifuse layer and a bottom electrode which are immune to the damages caused by harmful processing environment. The three major components of the antifuse—the bottom electrode, the antifuse layer and the top buffer layer—are formed consecutively without any photolithography or etching step in-between. The top buffer layer is defined before the bottom electrode. This antifuse structure can substantially improve the antifuse manufacturability.

2 Claims, 9 Drawing Sheets

ANTIFUSE STRUCTURES WITH IMPROVED MANUFACTURABILITY

This patent application relates to a provisional patent application, "Antifuse Structures with Improved Manufacturability", provisional patent application Ser. No. 60/023,687, filed on Aug. 16, 1996.

BACKGROUND

1. Technical Field of the Invention

This invention relates to integrated circuits, and more particularly to an electrically programmable antifuse with improved manufacturability.

2. Prior Arts

Antifuse is a nonvolatile switching device used in semiconductor integrated circuits. It has been extensively used in Field Programmable Gate Arrays (FPGAs) and Programmable Read-Only Memorys (PROMs). A typical antifuse comprises a bottom electrode, an insulating antifuse layer and a top electrode. The bottom electrode provides a bottom routing channel while the top electrode provides a top routing channel. Separated from the bottom electrode by the antifuse layer, the top electrode of an unprogrammed antifuse has no electrical connection with the bottom electrode. Passage of a current sufficiently large through an antifuse can cause electrical connection between two electrodes. An antifuse is the basic unit in an FPGA chip to perform the switching function between logic modules.

In an FPGA or PROM chip, there are millions of antifuses. They are all expected to have a similar behavior. Excessive leakage in a single unprogrammed antifuse could be detrimental to the functionality of a whole chip. To ensure a high chip yield, the antifuse layer is required to have a low defect density. Because of its uniqueness, antifuse needs to fulfill more stringent defect density requirements than other conventional ICs.

Defects could be intrinsic or extrinsic. Intrinsic defects are the defects inherent in the antifuse layer. Extrinsic defects are introduced during manufacturing process. Intrinsic defects can be addressed only by a careful selection of antifuse material. Extrinsic defects, on the other hand, can be reduced by optimizing antifuse structure and/or improving manufacturing steps. Numerous prior arts have proposed antifuse structures to improve manufacturability. But during manufacturing process, they all introduce extrinsic defects to the antifuse layer one way or the other.

Figure 1A:
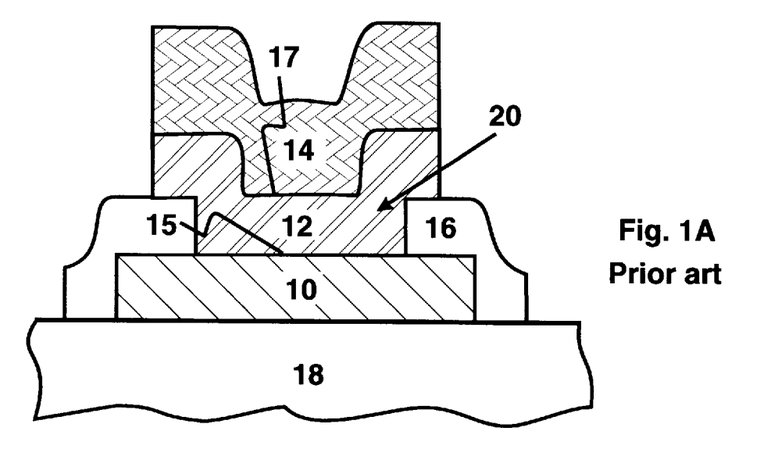
FIGS. 1A–1C are cross-sectional view of the prior art antifuse structures.
Figure 1B:
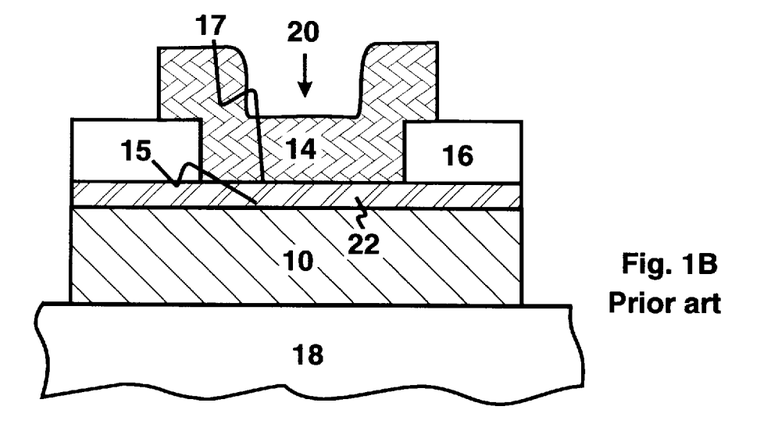
Figure 1C:
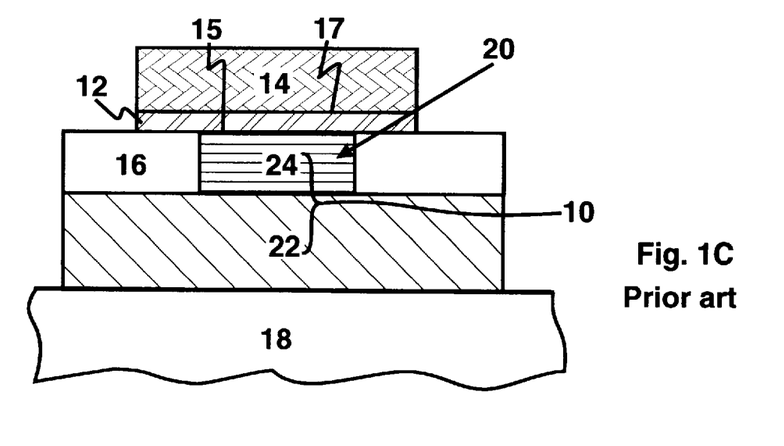

U.S. Pat. No. 4,914,055 issued to Gordon et al. on Apr. 3, 1990 described a process to make an antifuse structure by successively depositing a bottom layer of TiW 10, a layer of amorphous silicon 12, and a top layer of TiW 14 on substrate 18. As is illustrated in FIG. 1A, amorphous silicon layer 12 is deposited in an antifuse via 20, formed in a field oxide layer 16. FIG. 1B illustrates another antifuse structure described by U.S. Pat. No. 5,196,724 issued to Gordon et al. on Mar. 23, 1993. According to this invention, amorphous silicon layer 22 is first deposited on the bottom electrode 10, then the field oxide 16 is deposited and an antifuse via is formed therein. The top electrode 14 is deposited and patterned thereafter in the antifuse via 20. In this antifuse structure, amorphous silicon layer 12 is planar. Hawley et al. described an antifuse structure in U.S. Pat. No. 5,308,795 issued May 3, 1994. As is illustrated in FIG. 1C, the bottom electrode 10 is formed first. Then the field oxide 16 is deposited over the bottom electrode 10 and a via 20 is etched therethrough. Then a planarized W plug 24 is formed by means such as Chemical Mechanical Polishing (CMP). This is followed by the formation of antifuse layer 12 and the top electrode 14.

One common problem with these inventions is that the first interface 15 between bottom electrode and antifuse layer and/or the second interface 17 between antifuse layer and top electrode is subjected to harmful processing environment during the antifuse manufacturing. Here, the first interface 15 refers to the common area shared by the bottom electrode 10 and the antifuse layer 22; the second interface 17 refers to the common area shared by the antifuse layer 22 and the top electrode 14. Photoresist, etching medium, CMP brush or even "dirty" air are representative of harmful processing environment. They can introduce foreign particle and/or cause severe surface damage. For example, masking of the field oxide 16 can leave residue photoresist in the antifuse via 20 in FIGS. 1A and 1B. In the meantime, etching of the field oxide 16 will cause a roughened surface of the bottom electrode 10 in FIG. 1A and a nonuniform antifuse layer 12 in FIG. 1B. CMP brush can also cause scratch on the W plug 24 in FIG. 1C. Accordingly, the breakdown voltage of the antifuse layer 12 is not well under control. As a result, yield of the integrated circuit using these antifuse structures is questionable.

In order to overcome the foregoing disadvantages of prior art antifuses, a new antifuse structure is disclosed in the present invention. According to the present invention, the bottom electrode and the antifuse layer are not subjected to harmful processing environment during the antifuse manufacturing.

OBJECTS AND ADVANTAGES

It is a principle object of the present invention to provide an antifuse structure with an improved manufacturability.

It is a further object of the present invention to provide an antifuse structure with an improved yield.

It is a further object of the present invention to provide an antifuse structure with a repeatable and controllable breakdown voltage.

It is a further object of the present invention to prevent the first interface between the bottom electrode and the antifuse layer from being exposed to harmful processing environment.

It is a further object of the present invention to prevent the second interface between the antifuse layer and the top electrode from being exposed to harmful processing environment.

In accordance with these and other objects of the invention, a new antifuse structure is described in the following detailed description of the preferred embodiments which are illustrated in various drawing figures.

SUMMARY OF THE INVENTION

The present invention provides an antifuse structure with an improved manufacturability. According to the present invention, the bottom electrode, the antifuse layer and the top buffer layer are formed successively. The absence of masking, etching or planarizing eliminates any possibility of foreign particle introduction and damage to the exposed surface during manufacturing. Moreover, this forming step can be performed in a cluster tool. In a cluster tool, the wafers are transferred in vacuum or clean air and therefore results in no foreign particle introduction. Hence, the bottom electrode and the antifuse layer are not subjected to harmful processing environment. The present invention eliminates any possibility to introduce defects during manufacturing. The only possible cause of premature breakdown is from the intrinsic defects of the antifuse layer. Compared with prior arts, this antifuse structure has less defects and therefore an improved manufacturability.

DETAILED DESCRIPTION OF THE PREFERRED EMBODIMENT

Those of ordinary skills in the art will realize that the following description of the present invention is illustrative only and is not intended to be in any way limiting. Other embodiments of the invention will readily suggest themselves to such skilled persons from an examination of the within disclosure.

It has been discovered that the prior art antifuse structures in FIGS. 1A–1C have certain disadvantages. In particular, the first interface 15 and/or the second interface 17 are exposed to harmful processing environment. This could introduce foreign particle and/or damage the exposed surface. Hence, the yield of the integrated circuit is questionable. FIG. 1A illustrates an antifuse structure whose antifuse layer 12 is deposited in the antifuse via 20 formed through the field oxide 16. During the via formation, the surface of the bottom electrode 10 is roughened. This may cause a nonuniform antifuse layer 12. In another antifuse structure illustrated by FIG. 1B, the antifuse layer 12 is immediately disposed after the bottom electrode 20. Then the top electrode 14 is formed through the via 20 in the field oxide 16. Apparently, to ensure a good via formation, some oxide overetch is required. Unfortunately, this oxide overetch removes portions of the antifuse layer 12. This results in variation of antifuse layer thickness from antifuse to antifuse. FIG. 1C illustrates that a W plug 24 is formed through planarization of the W plug 24 and field oxide 16. Then antifuse layer 12 is formed on top of the W plug 24. During the planarization step such as CMP, the surface of the W plug 24 can be easily damaged. Accordingly, the antifuse layer 12 could have a poor quality.

The present invention eliminates some of the disadvantages with the prior art antifuses. Most importantly, it eliminates any possibility to introduce foreign particle or damage to the surface of the antifuse layer 62 and the bottom electrode 64 during manufacturing steps. As a result, yield can be improved.

Figure 2:
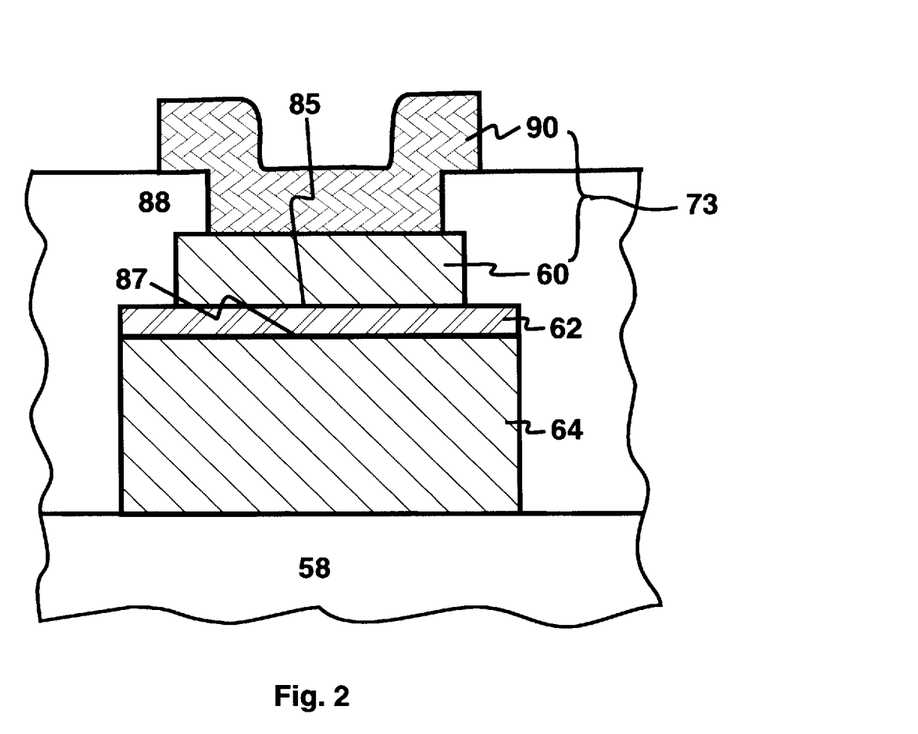
FIG. 2 is a cross-sectional view of a preferred antifuse structure according to the present invention.

FIG. 2 is a cross-sectional view of a preferred antifuse structure of the present invention. According to the present invention, the bottom electrode 64, the antifuse layer 62 and the top buffer layer 60 are formed successively. Here, the common area shared by the bottom electrode 64 and the antifuse layer 62 is referred to as the first interface 87; the common area shared by the antifuse layer 62 and the top electrode 60 is referred to as the second interface 85. The possibility to expose the first interface 87 or the second interface 85 to harmful processing environment is minimized. The bottom electrode 64 provides a bottom routing channel. Top routing channel, using the top routing electrode 90, is formed in a separate step. The top electrode 73 comprises the top buffer layer 60 and top routing electrode 90. The detailed fabrication steps of this antifuse structure is illustrated in FIGS. 3–6.

Figure 3A:
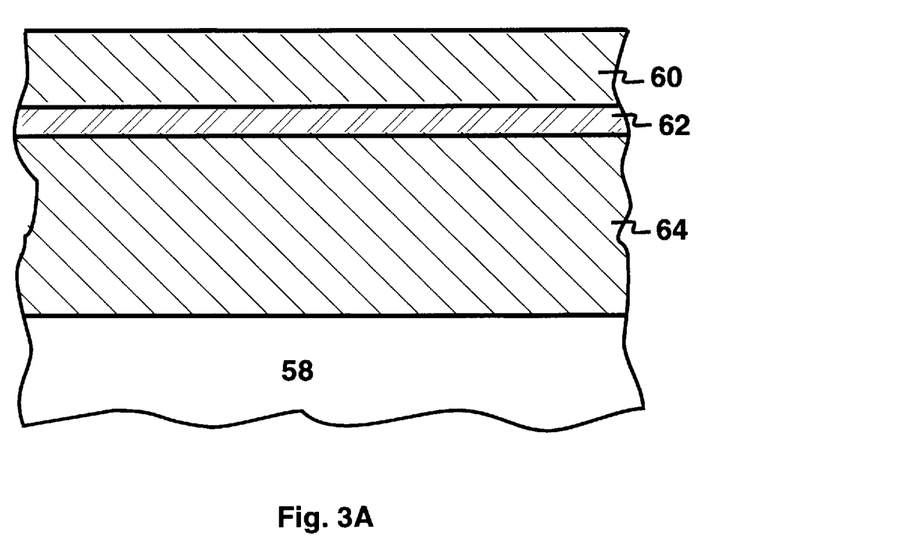
FIG. 3A is a cross-sectional view of a first preferred bottom electrode.
Figure 3B:
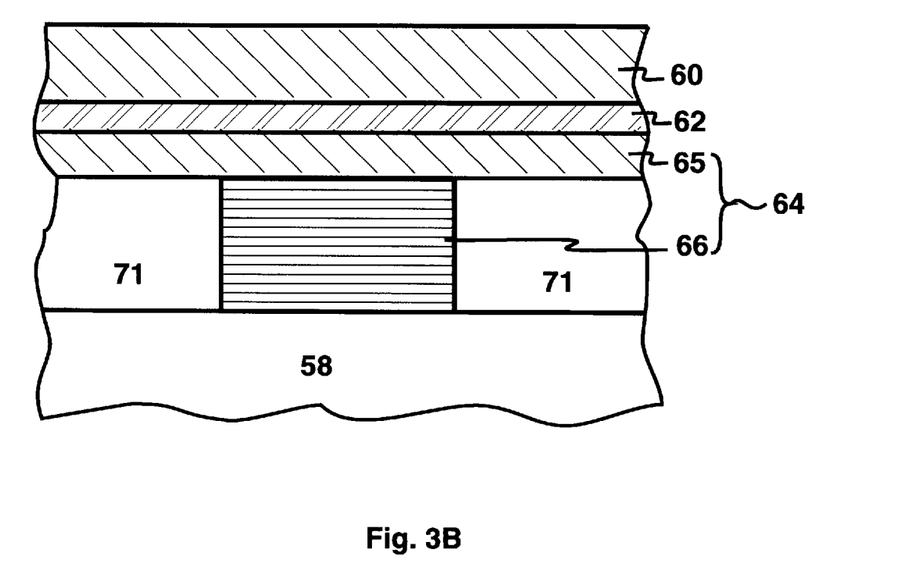
FIG. 3B is a cross-sectional view of a second preferred bottom electrode.

FIGS. 3A and 3B illustrate first and second preferred bottom electrodes of the present invention. These figures show a critical step in the antifuse manufacturing. The bottom electrode 64, the antifuse layer 62 and the top buffer layer 60 are consecutively formed on top of each other. The absence of any masking, etching or planarizing eliminates the possibility of foreign particle or damage to the exposed surface during manufacturing. Moreover, this step can be performed in a cluster tool. In a cluster tool, the wafers are transferred in vacuum or clean air and therefore results in no foreign particle introduction. Hence, neither surface of the bottom electrode 64 and the antifuse layer 62 is exposed to any harmful processing environment. As a result, no contamination or damage is introduced to the interface between the bottom electrode 64 and the antifuse layer 62 as well as the interface between the antifuse layer 62 and the top buffer layer 60. The only source of defects is from the intrinsic defects of the antifuse layer 62. This can only be improved by a better selection of antifuse material. Once electrode materials and antifuse materials are selected, this antifuse structure would have the best yield among all known antifuse structures.

As is illustrated in FIG. 3A, the first preferred bottom electrode 64 is formed on a substrate 58. The bottom electrode 64 also provides the bottom routing channel. Those of ordinary skills in the art will recognize that the bottom electrode 64 comprises metallic materials. Here, metallic materials include element metals, metal alloys and metal compounds. The bottom electrode 64 can also be a composite layer, including an adhesion-promoting layer, a conductive layer, a barrier layer and a base layer. The adhesion-promoting layer is optional. It uses materials such as Ti, TiN, Cr and TiW with a thickness of 100–1000 Å, preferably around 500 Å. It promotes adhesion between the bottom electrode 64 and the underlying substrate 58. The conductive layer may comprise a metal with good electrical conductivity, such as Al, Cu, Ag and Au. Its thickness is in the range of 1000 Å-2 μm, preferably around 5000 Å. It provides a good conductive path for electrical signals. The barrier layer comprises a refractory metal, such as W, Mo, Ti and TiW. Its thickness is 500–3000 Å, preferably around 1000 Å. It ensures no reaction between the antifuse layer 62 and the conductive layer at the high processing temperature. To those who are familiar with the art, the need for barrier layer strongly depends on the reactivity between the conductive material and the antifuse material. If the antifuse material is chemically stable and does not react with the conductive material at temperature around 450° C., it is not necessary to insert a barrier layer between the conductive layer and antifuse layer 62. A base layer is needed, if the antifuse material is metal oxides formed by oxidizing the top surface of the bottom electrode 64. The base layer is on top of the bottom electrode 64. It comprises elemental metals from which metal oxides are formed. It has a thickness of 50–1000 Å, preferably around 200 Å. For example, a layer of Cr is needed for the base layer if the antifuse material is thermal Cr oxide.

Antifuse layer 62 comprises insulating materials. It exhibits high resistance before programming and can be switched to a low resistance by the passage of a current sufficiently large. There are a lot of promising candidates for antifuse layer 62. For example, it can be a layer of amorphous silicon, with thickness in the range of 100–5000 Å, preferably around 1000 Å. Another good candidate is protective ceramic materials. Protective ceramic material are free of pinholes and can densely cover a metal surface. Hence, antifuse structures will have an excellent yield using protective ceramic materials as their antifuse material. The methods to form protective ceramic materials include: 1) depositing means, e.g. chemical vapor deposition (CVD) and sputtering; and 2) growing means, such as thermal oxidation, plasma oxidation and anodization. The typical thickness of protective ceramic materials for antifuse applications is from 30 Å to 1 $\mu$m, preferably around 100Å. Multi-layered structure such as the stacked layer of $SiO_2$/$Cr_2O_3$ is an even better candidate for the antifuse layer 62. This is because the chances for pinholes in one layer to align with another is small and therefore there is a lower defect density.

The material used in the top buffer layer 60 is flexible. It could comprise refractory metals and their compounds such as Ti, W, Mo and TiW, with a thickness ranging from 100 Å to 1 $\mu$m, preferably around 1000Å.

FIG. 3B illustrates the second preferred bottom electrode of the present invention. A bottom routing electrode 66 is formed and planarized in a trench in an interlayer dielectric 71. It provides the bottom routing channel. The bottom routing channel may comprise a adhesion-promoting layer and a conductive layer, as disclosed in FIG. 3A. Then a bottom buffer layer 65, the antifuse layer 62 and the top buffer layer 60 are formed consecutively over the bottom routing electrode 66 and the interlayer dielectric 71. The bottom buffer layer 65 may comprise a barrier layer and a base layer, as disclosed in FIG. 3A. The total thickness of the bottom buffer layer 65 can range from 200 Å to 5000 Å, preferably around 1500 Å.

FIGS. 4A–4F illustrate the defining of the top buffer layer 60 in various preferred embodiments of the present invention. In these figures, the bottom electrode 64 is also the bottom routing channel, as shown in FIG. 3A. For those who are familiar with the art, the antifuse structure shown in FIG. 3B can also use the techniques illustrated in FIGS. 4A–4F.

Figure 4A:
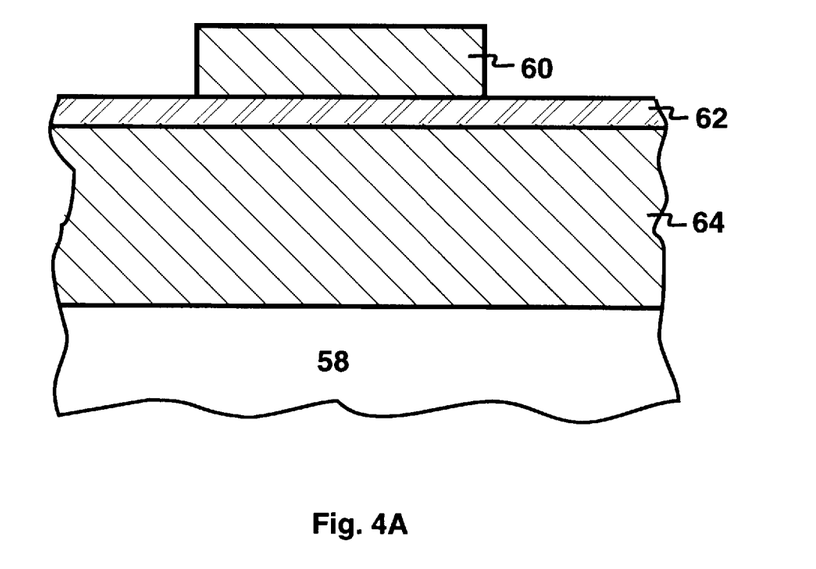
FIG. 4A is a cross-sectional view of a first preferred antifuse layer.

FIG. 4A illustrates the first preferred top buffer layer 60 of the present invention. The top buffer layer 60 is masked and etched to expose a portion of the antifuse layer 62. This involves a careful selection of the top buffer material, the antifuse material and the etch recipe. One example is to use W as the top buffer material and amorphous silicon or PECVD silicon oxide as the antifuse material. The hydrogen peroxide, etchant used to etch W, has little effect on amorphous silicon or PECVD silicon.

Figure 4B:
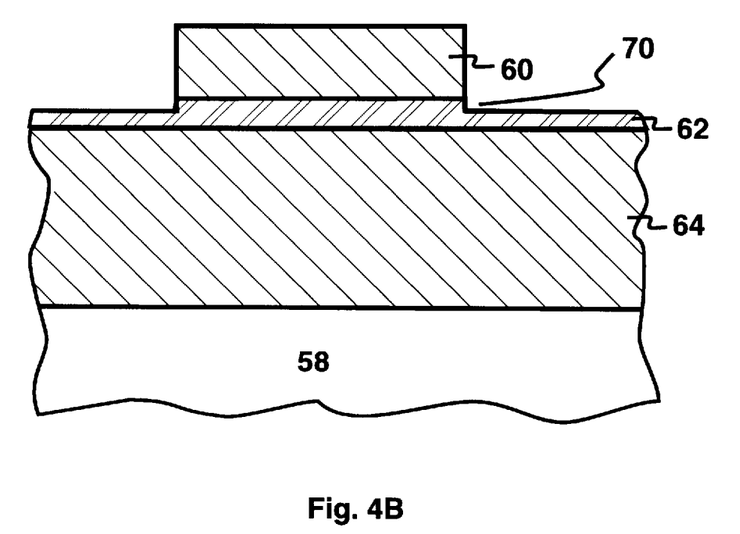
FIG. 4B is a cross-sectional view of a second preferred antifuse layer.

FIG. 4B illustrates the second preferred top buffer layer 60 of the present invention. When the antifuse layer 62 is thick, a portion 70 of the antifuse layer 62 can be etched without affecting the yield. For example, when amorphous silicon is used as the antifuse material, its thickness is around 1000 Å. If the etching selectivity between the top buffer layer 60 and the antifuse layer 62 is not very good, it is acceptable to remove up to 600 Å of amorphous silicon during overetch.

Figure 4C:
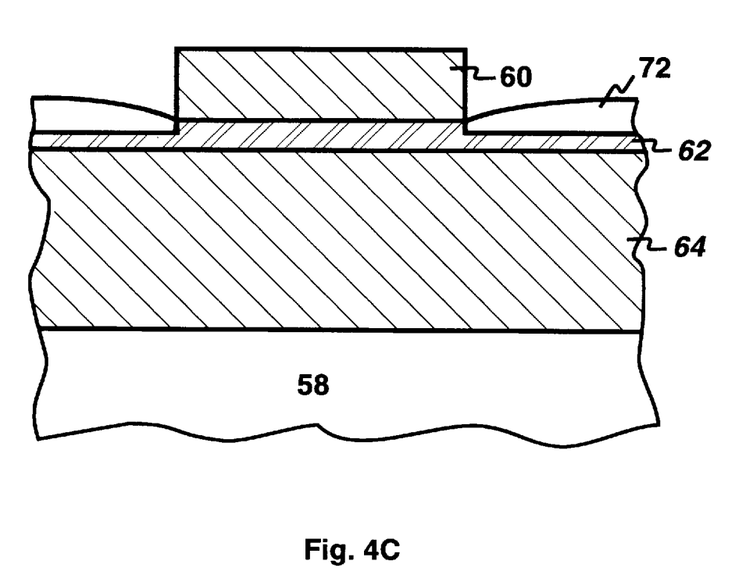
FIG. 4C is a cross-sectional view of a third preferred antifuse layer.

FIG. 4C illustrates the third preferred top buffer layer 60 of the present invention. It involves the formation of a dielectric layer 72 on the exposed portion of the antifuse layer 62. It can be performed by thermal oxidation/ nitridation, plasma oxidation/nitridation, anodization or other means. This step is similar to the re-oxidation step after the gate definition in the traditional MOS process. It can repair the damage caused to the antifuse layer during the etching of the top buffer layer 60. If amorphous silicon is used as the antifuse material, an oxidation step can be performed to convert a portion of the exposed amorphous silicon to silicon oxide 72. This oxide layer 72 can compensate the amorphous silicon thinning and prevent antifuse breakdown from occurring near the edge of the top buffer layer 60.

Figure 4D:
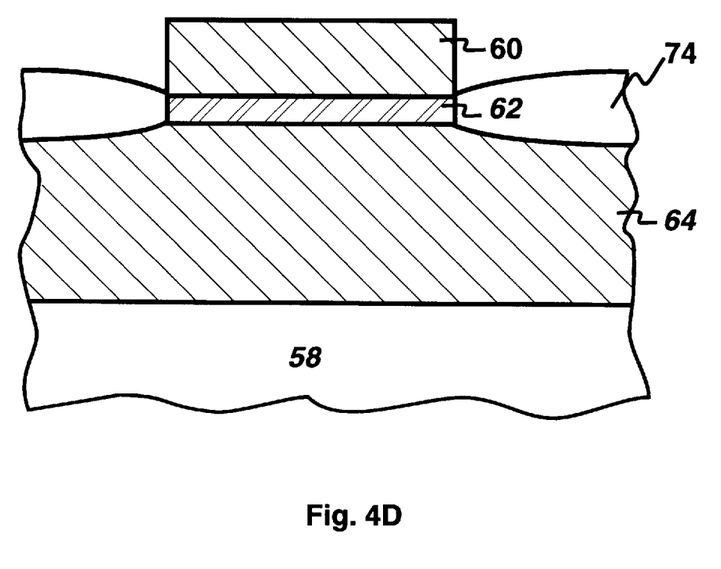
FIG. 4D is a cross-sectional view of a fourth preferred antifuse layer.

FIG. 4D illustrates the fourth preferred top buffer layer 60 of the present invention. Comparing FIG. 4D and FIG. 4C, the oxidation is more thorough in FIG. 4D. Part of the bottom electrode 64 is oxidized. It serves the same purpose as in FIG. 4C.

Figure 4E:
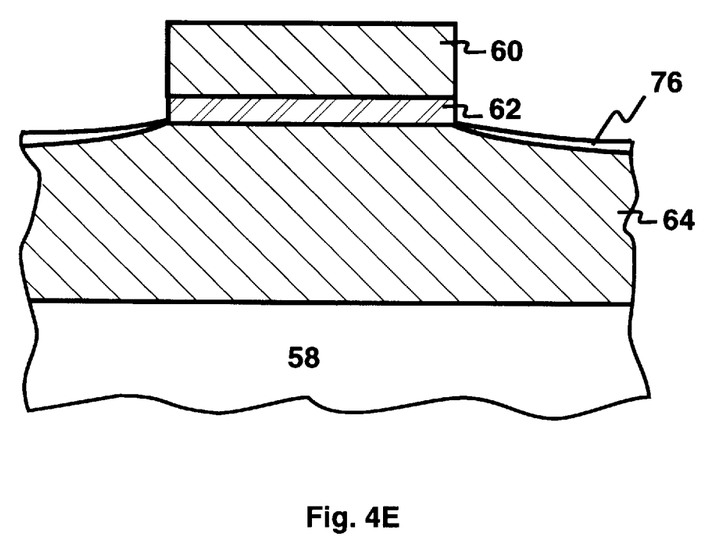
FIG. 4E is a cross-sectional view of a fifth preferred antifuse layer.

FIG. 4E illustrates the fifth preferred top buffer layer 60 of the present invention. According to this embodiment, a portion of the bottom electrode 64 is removed during masking and etching of the top buffer layer 60. An oxidation step similar to that in FIG. 4D is then performed and serves the purpose of preventing breakdown from occurring near the edge of the top buffer layer 60.

Figure 4F:
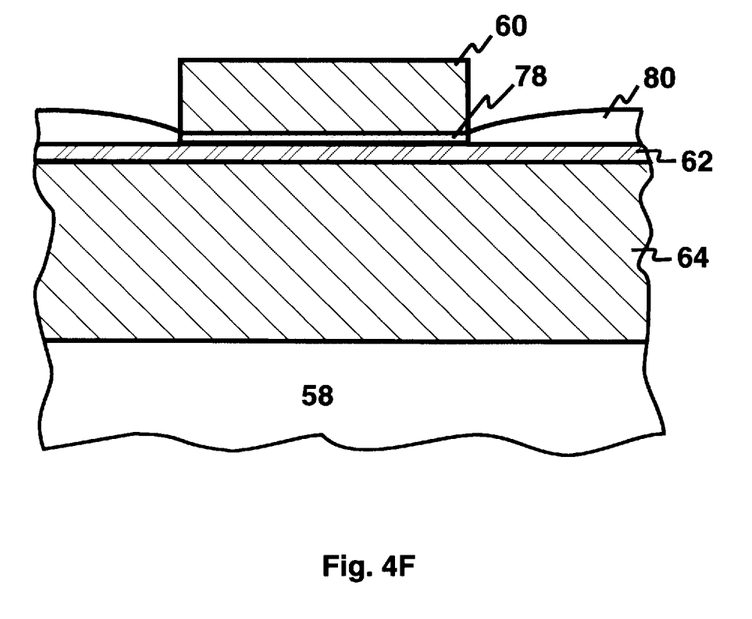
FIG. 4F is a cross-sectional view of a sixth preferred antifuse layer.

FIG. 4F illustrates the sixth preferred top buffer layer 60 of the present invention. There is an etchstop layer 78 between the top buffer layer 60 and the antifuse layer 62. If the top buffer layer 80 comprises W, the etchstop layer 74 could use Al, with a thickness in the range of 30 Å to 1000 Å, preferably 100 Å. The etching recipe of the top buffer layer 60 can be selected in such a way that said etching essentially stops on top of the etchstop layer 78. As a result, the antifuse layer 62 is not damaged during the etching. Thereafter, an oxidation step is performed to completely convert the etchstop layer 78 to a protective dielectric layer 80. This protective dielectric layer 80 can also prevent breakdown from occurring near the edge of the top buffer layer 60.

Figure 5A:
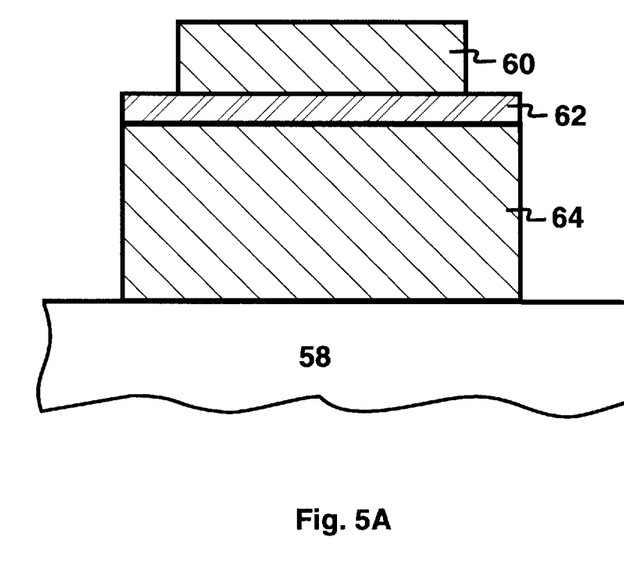
FIG. 5A is a cross-sectional view of the antifuse stack with the first preferred bottom electrode after masking and etching of the bottom electrode.
Figure 5B:
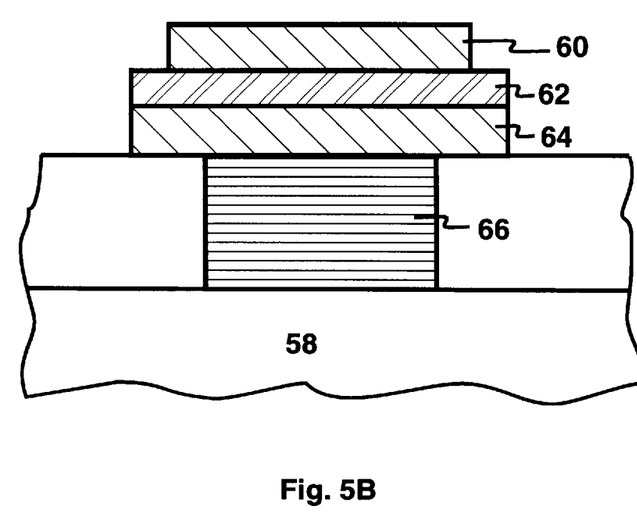
FIG. 5B is a cross-sectional view of the antifuse stack with the second preferred bottom electrode after masking and etching of the bottom electrode.

FIGS. 5A and 5B illustrate the formation of the antifuse stack for various embodiments of the present invention. It should be noted that, for simplicity, the interface between the top buffer layer 60 and the antifuse layer 62 is drawn following the example shown in FIG. 4A. In fact, for those who are familiar in the art, any variation of this interface in FIGS. 4A–4F can be incorporated in FIGS. 5A and 5B.

FIG. 5A is a cross-sectional view of the antifuse stack with the first preferred bottom electrode after masking and etching of the bottom electrode. The antifuse stack is formed by masking and etching of the bottom electrode 64. A similar technique can be used to form the antifuse stack with the second preferred bottom electrode after masking and etching of the bottom electrode, as illustrated in FIG. 5B.

Figure 5C:
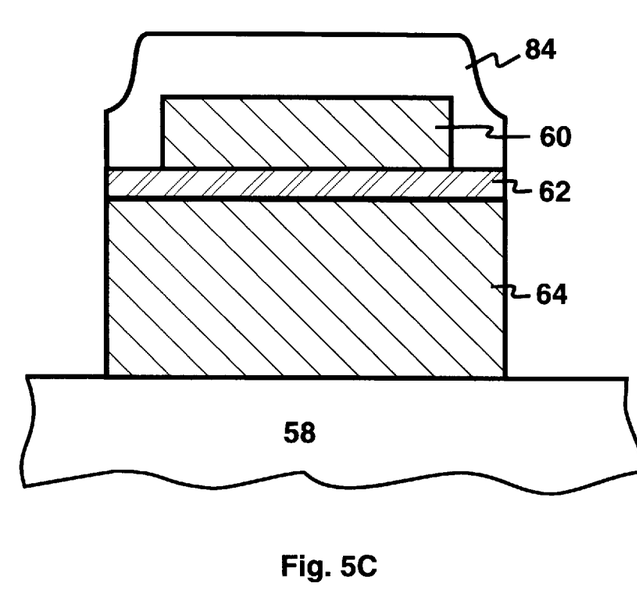
FIG. 5C is a cross-sectional view of an alternate antifuse stack with the first preferred bottom electrode after masking and etching of the bottom electrode.

FIG. 5C illustrates an alternate antifuse stack with the first preferred bottom electrode after masking and etching of the bottom electrode. For this preferred embodiment, a layer of passivation dielectric 84 is deposited on the wafer surface immediately after masking and etching of the top buffer layer 60. This passivation dielectric 84 could be silicon nitride or silicon oxide, with a thickness from 500 Å to 5000 Å, preferably 1000 Å. It seals the exposed surface of the antifuse layer 62 and prevents the antifuse layer 62 from being attacked in the subsequent etching steps.

Figure 6A:
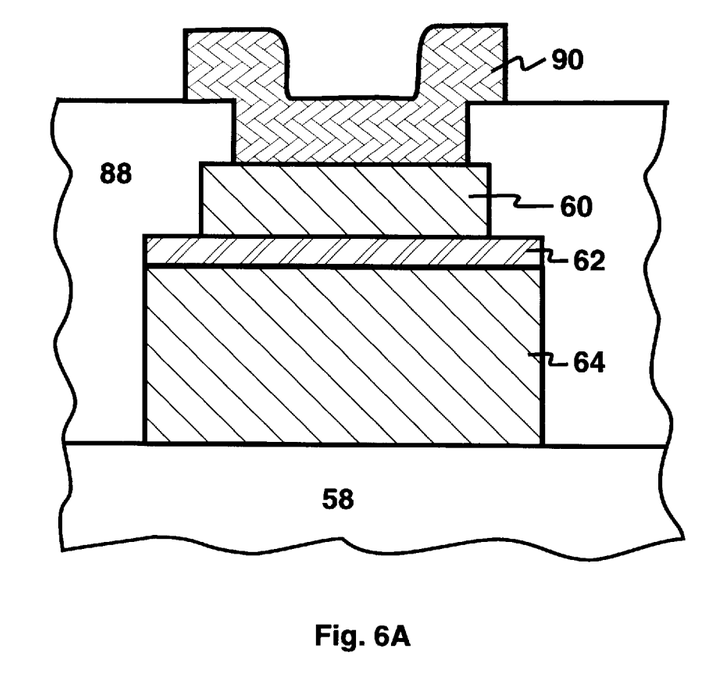
FIG. 6A is a cross-sectional view of the antifuse structure with the first preferred bottom electrode after masking and etching of the top routing electrode.
Figure 6B:
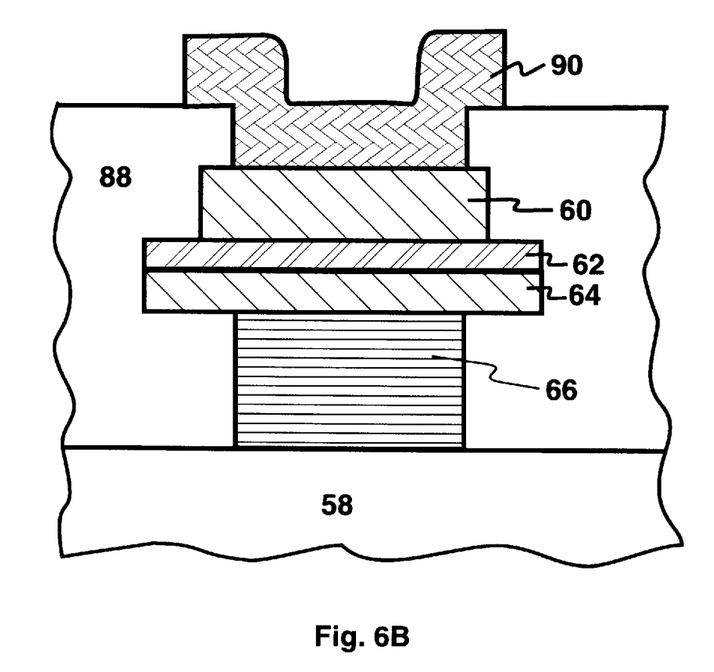
FIG. 6B is a cross-sectional view of the antifuse structure with the second preferred bottom electrode after masking and etching of the top routing electrode.

FIGS. 6A and 6B are a cross-sectional views of the antifuse structure with the first and second preferred bottom electrode after masking and etching of the top routing electrode. A layer of interlevel dielectric 88 is deposited on top of the antifuse stacks and filled the gaps in-between. Then contact via is made therethrough and expose a portion of the top buffer layer 60. This is followed by the formation of the top routing electrode 90. The top routing electrode 90 uses metallic materials with high conductivity, like Al, Cu, or Au. As a result, the resistance of the top routing electrode 90 is minimized and circuit speed can be improved.

Figure 7:
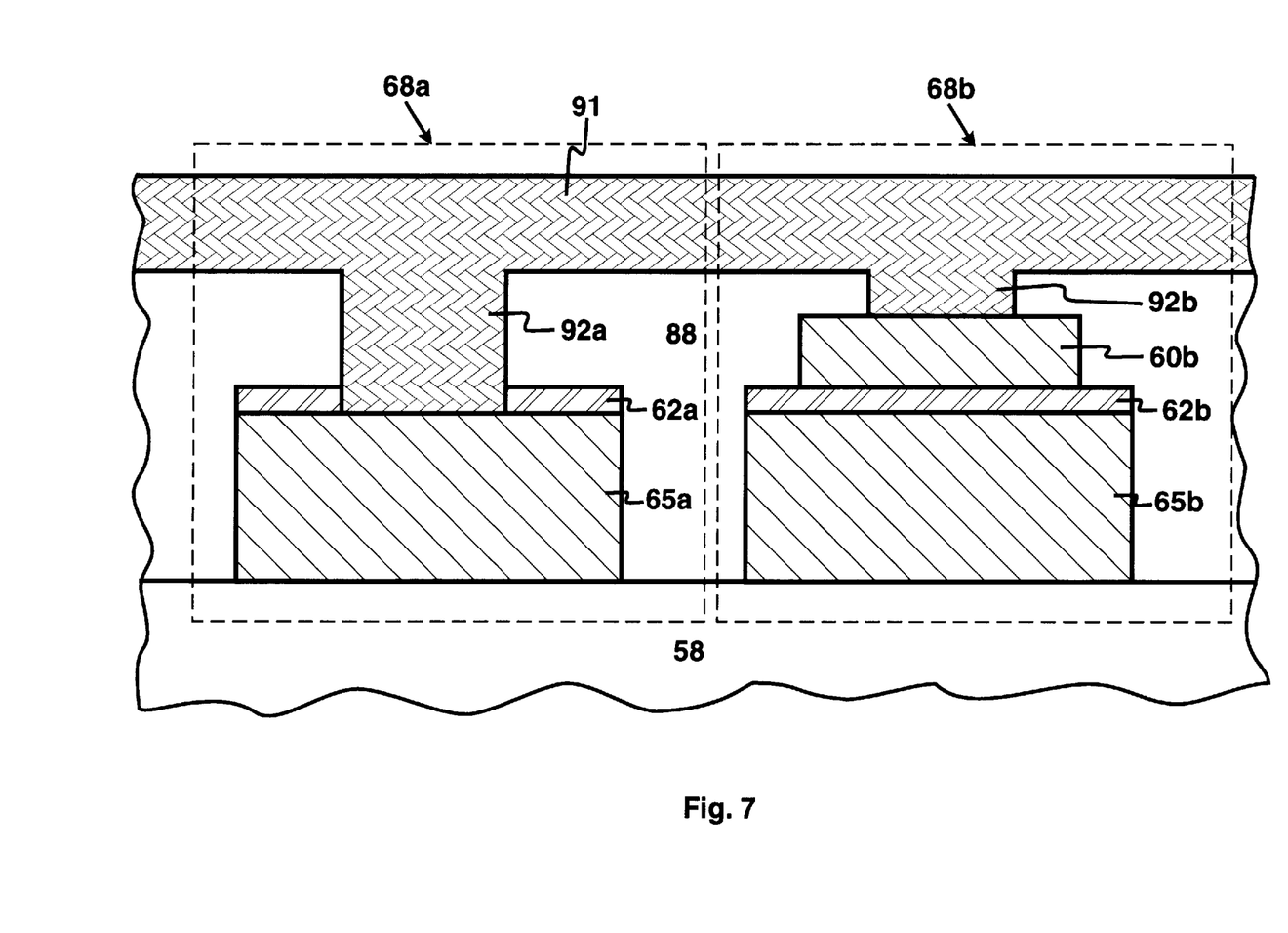
FIG. 7 illustrates two configurations. In one configuration the top and bottom routing channels are connected by a contact via, while in another configuration, by an antifuse of the present invention.

FIG. 7 shows a cross-sectional illustration of two configurations 68a, 68b between the top routing channel 91 and the bottom routing channels 65a and 65b. In the configuration 68b, the top routing channel 91 is separated from the bottom routing channels 65b by an antifuse 68b. On the other hand, in the configuration 68a, the top routing channel 91 is connected with the bottom routing channel 65a by a contact via 92a. During masking and etching of the top buffer layer 60, no top buffer material remains at the via site 92a as long as it is a clear field for the top buffer layer mask. Thereafter, contact vias 92a and 92b are masked and etched at the same time. Finally, metallic materials are filled in the vias 92a, 92b and the top routing channel 91 is formed.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. An antifuse in an integrated circuit comprising:

a conductive bottom electrode;

a conductive top buffer layer;

an antifuse layer between said conductive bottom electrode and said conductive top buffer layer, said antifuse layer having a high resistance when unprogrammed and having a low resistance after being programmed, said antifuse layer touching a first portion of said conductive bottom electrode and a second portion of said conductive top buffer layer; and a first and second interfaces of said antifuse layer, said first interface being a first common area shared by said conductive bottom electrode and said antifuse layer, said second interface being a second common area shared by said antifuse layer and said conductive top buffer layer, said first and second interfaces are only exposed to material-forming ambient.

2. The antifuse of claim 1 further comprising:

an insulating layer overlaying said conductive top buffer layer and having an opening therethrough, said opening exposing a third portion of said conductive top buffer layer; and a conductive top routing electrode in said opening.

* * * * *